United States Patent
Wu et al.

(10) Patent No.: US 8,476,154 B2
(45) Date of Patent: Jul. 2, 2013

(54) METHOD OF MAKING A CHARGE TRAPPING NON-VOLATILE SEMICONDUCTOR MEMORY DEVICE

(75) Inventors: Dongping Wu, Shanghai (CN); Shi-Li Zhang, Stockholm (SE)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/255,495

(22) PCT Filed: Jan. 4, 2011

(86) PCT No.: PCT/CN2011/000015
§ 371 (c)(1),
(2), (4) Date: Sep. 8, 2011

(87) PCT Pub. No.: WO2011/091707
PCT Pub. Date: Aug. 4, 2011

(65) Prior Publication Data
US 2011/0316070 A1    Dec. 29, 2011

(30) Foreign Application Priority Data

Jan. 29, 2010   (CN) .......................... 2010 1 0103437

(51) Int. Cl.
| H01L 21/44 | (2006.01) |
| H01L 21/28 | (2006.01) |
| H01L 21/338 | (2006.01) |
| H01L 21/8238 | (2006.01) |
| H01L 21/425 | (2006.01) |
| H01L 21/265 | (2006.01) |

(52) U.S. Cl.
USPC ........... 438/583; 438/181; 438/233; 438/301; 438/514; 438/523; 438/597; 438/660; 438/664; 438/675; 257/324; 257/E21.047; 257/E21.064; 257/E21.423; 257/E21.425; 257/E21.613; 257/E21.634; 257/E21.658; 257/E21.679

(58) Field of Classification Search
USPC ................. 438/181, 233, 301, 514, 523, 597, 438/660, 664, 675; 257/324, E21.047, E21.064, 257/E21.423, E21.425, E21.613, E21.634, 257/E21.658, E21.679
See application file for complete search history.

(56) References Cited

U.S. PATENT DOCUMENTS

| 6,534,355 B2 * | 3/2003 | Ito et al. ........................ 438/201 |
| 6,570,214 B1 * | 5/2003 | Wu ............................... 257/315 |
| 8,233,244 B2 * | 7/2012 | Fujimoto ..................... 360/294.4 |
| 2002/0163032 A1 * | 11/2002 | Lin et al. ...................... 257/315 |
| 2002/0190323 A1 * | 12/2002 | Aoki ............................ 257/351 |

(Continued)

OTHER PUBLICATIONS

Source-side injection Schottky barrier flash memory cells, Semicond. Sci. Technol. 24 (2009) 025013 5 pg.

*Primary Examiner* — Cheung Lee
*Assistant Examiner* — Jeremy Joy
(74) *Attorney, Agent, or Firm* — Jamie J. Zheng, Esq.

(57) ABSTRACT

The present invention provides a charge trapping non-volatile semiconductor memory device and a method of making the device. The charge trapping non-volatile semiconductor memory device comprises a semiconductor substrate, a source region, a drain region, and, consecutively formed over the semiconductor substrate, a channel insulation layer, a charge trapping layer, a blocking insulation layer, and a gate electrode. The drain region includes a P-N junction, and the source region includes a metal-semiconductor junction formed between the semiconductor substrate and a metal including titanium, cobalt, nickel, platinum or one of their various combinations. The charge trapping non-volatile semiconductor memory device according to the present disclosure has low programming voltage, fast programming speed, low energy consumption, and relatively high device reliability.

8 Claims, 6 Drawing Sheets

U.S. PATENT DOCUMENTS

| | | | |
|---|---|---|---|
| 2004/0029322 A1* | 2/2004 | Prall | 438/142 |
| 2007/0020796 A1* | 1/2007 | Park | 438/57 |
| 2008/0070362 A1* | 3/2008 | Yaegashi et al. | 438/261 |
| 2008/0153298 A1* | 6/2008 | Hui et al. | 438/703 |
| 2008/0157160 A1* | 7/2008 | Chan | 257/315 |
| 2010/0078735 A1* | 4/2010 | Hoentschel et al. | 257/408 |

* cited by examiner

METHOD OF MAKING A CHARGE TRAPPING NON-VOLATILE SEMICONDUCTOR MEMORY DEVICE

TECHNICAL FIELD

The present invention is related to non-volatile memory devices, and more particularly to a charge trapping non-volatile semiconductor memory device and method of making the same.

BACKGROUND

Non-volatile memory, due to its low energy consumption, small volume, high density, re-programmability and other characteristics, has wide applications in technology fields such as mobile communications, data terminals, multi-media, consumer electronics, defense electronic equipment, and so on.

Non-volatile memory mainly includes floating-gate non-volatile semiconductor memory and charge trapping non-volatile semiconductor memory. A floating-gate non-volatile semiconductor memory device stores charge in a floating gate formed using polysilicon. Thus, any defects related to the polysilicon floating gate can reduce charge retention time. On the other hand, a charge trapping non-volatile semiconductor memory device uses a nitride layer in place of the polysilicon. Charge is stored in the nitride layer, which is less sensitive to defects. Furthermore, compared to floating-gate non-volatile semiconductor memory, charge trapping non-volatile semiconductor memory is more suitable for miniaturization. Moreover, charge trapping non-volatile semiconductor memory has other advantages such as separated storage medium, thinner tunnel oxide layer, better data retention, and complete compatibility with microelectronics fabrication processes. Therefore, charge trapping non-volatile semiconductor memory is now expected to gradually replace floating-gate non-volatile semiconductor memory for sub-30 nm technologies.

Generally speaking, programming and erasure of a charge trapping non-volatile semiconductor memory device are done by hot-channel electron injection and hot-channel hole injection. The programming of a charge trapping non-volatile semiconductor memory device can be done by traditional hot-channel electron injection near a drain terminal. The erasure of a charge trapping non-volatile semiconductor memory device can be done by hot-channel hole injection near the drain terminal. Currently, both source and drain terminals of charge trapping non-volatile semiconductor memory devices are structured as P-N junctions.

As the device sizes shrink further, however, the channel length of the above mentioned charge trapping non-volatile semiconductor memory devices becomes shorter. When both source and drain of a charge trapping non-volatile semiconductor memory device are structured as P-N junctions, it is difficult to reduce the programming voltage, improve hot-channel electron injection efficiency, increase programming speed, and reduce energy consumption while still generating sufficient hot-channel electron or hole injections near the drain.

SUMMARY

Because of the above problems in conventional charge trapping non-volatile semiconductor memory, there is a need to provide low programming voltage, high programming speed, low-energy consumption and high reliability charge trapping non-volatile semiconductor memory devices.

There is also a need to provide a method of making the low programming voltage, high programming speed, low-energy consumption and high reliability charge trapping non-volatile semiconductor memory devices.

A charge trapping non-volatile semiconductor memory device comprises a semiconductor substrate, a source region, a drain region, and, sequentially formed over the semiconductor substrate, a channel insulation layer, a charge trapping layer, a blocking insulation layer, and a gate electrode. The drain region includes a P-N junction. The source region includes a metal-semiconductor junction formed between the semiconductor substrate and a metal including one of titanium, cobalt, nickel, and platinum, or a combination thereof.

Preferably, the charge trapping non-volatile semiconductor memory device further includes a first metal layer formed over the gate electrode.

Preferably, the charge trapping non-volatile semiconductor memory device further includes a hard mask layer formed over the first metal layer.

Preferably, the semiconductor substrate includes a drain region and a source region. The channel insulation layer, the charge trapping layer, the blocking insulation layer, the gate electrode, the first metal layer, the hard mask layer being sequentially formed over a region in the semiconductor substrate other than the source region and the drain region.

Preferably, the charge trapping non-volatile semiconductor memory device further includes sidewalls formed in respective openings, which are formed in spaces over the semiconductor substrate corresponding to the source region and the drain region. The sidewalls extend from sides of the channel insulation layer to corresponding sides of the hard mask layer.

Preferably, the first metal layer includes tungsten or tungsten silicide.

A method of making the charge trapping non-volatile semiconductor memory device includes: providing a semiconductor substrate; forming in succession over the semiconductor substrate a channel insulation layer, a charge trapping layer, a blocking insulation layer, a gate electrode, a first metal layer, and a hard mask layer; etching successively the hard mask layer, the first metal layer, the gate electrode, the blocking insulation layer, the charge-trapping layer, and the channel insulation layer, thereby forming a first opening corresponding to the drain region and a second opening corresponding to the source region, each of the first and second openings exposing the semiconductor substrate; forming a first dielectric layer and etching the first dielectric layer while retaining part of the first dielectric layer in the second opening; implanting ions into the semiconductor substrate to form a P-N junction at the drain region; removing the first dielectric layer and forming sidewalls in the first and second openings, which extend from sides of the channel insulation layer to sides of the hard mask layer; forming a second metal layer to form a metal-semiconductor junction corresponding to the source region, the second metal layer including any one of a titanium metal layer, a cobalt metal layer, a nickel metal layer, and a platinum metal layer, or a combination thereof.

Preferably, a width of the first opening is larger than a width of the second opening. Preferably, a thickness of the first dielectric layer is larger than half the width of the second opening but smaller than half the width of the first opening.

Preferably, the first dielectric layer is silicon dioxide, silicon nitride or a combination thereof.

Preferably, the semiconductor substrate is a P-type substrate, and the ions implanted are N-type ions.

Preferably, forming the sidewalls includes depositing a second dielectric layer, etching part of the second dielectric layer while retaining portions of the second dielectric layer covering inside walls of the first and second openings to form the sidewalls.

Preferably, an annealing process is used to cause the second metal layer to react with the semiconductor substrate in the second opening so as to form metal silicide, which contacts the source region corresponding to the second opening to form the metal-semiconductor junction.

Preferably, the method further comprises removing part of the second metal layer that has not reacted with the semiconductor substrate.

The drain region and source region of the charge trapping non-volatile semiconductor memory device made using the method of the present invention have a P-N junction and a Schottky junction, respectively. The Schottky structure is formed between the semiconductor substrate and a metal including titanium, cobalt, nickel, platinum or a combination thereof. The barrier of the Schottky junction should be relatively low so that programming by hot electron injection near the source region can be effectively performed. Therefore, when using the charge trapping non-volatile semiconductor memory device, only low gate voltage and low drain voltage are needed to produce hot electrons near the source region, resulting in high hot-electron injection efficiency, low programming voltage, fast programming speed, and low energy consumption. Furthermore, the asymmetrical source/drain structure of the charge trapping non-volatile semiconductor memory device helps to reduce diode leakage toward the drain, increasing device reliability.

DETAILED DESCRIPTION OF THE EMBODIMENTS

Figure 1:
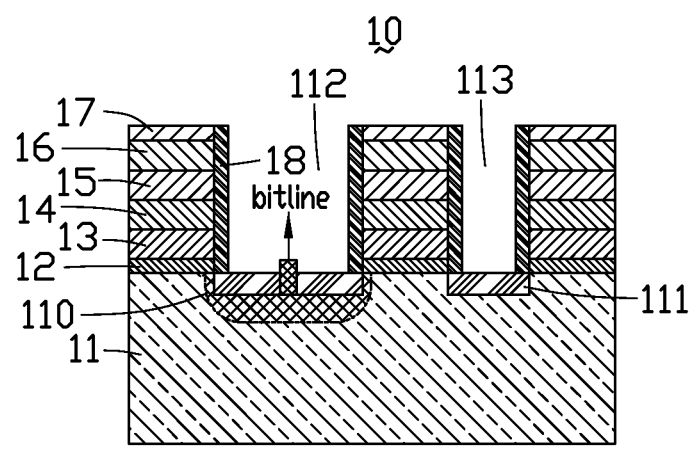
FIG. 1 is a cross-sectional diagram illustrating a charge trapping non-volatile semiconductor memory device according to embodiments of the present disclosure.
Figure 2:
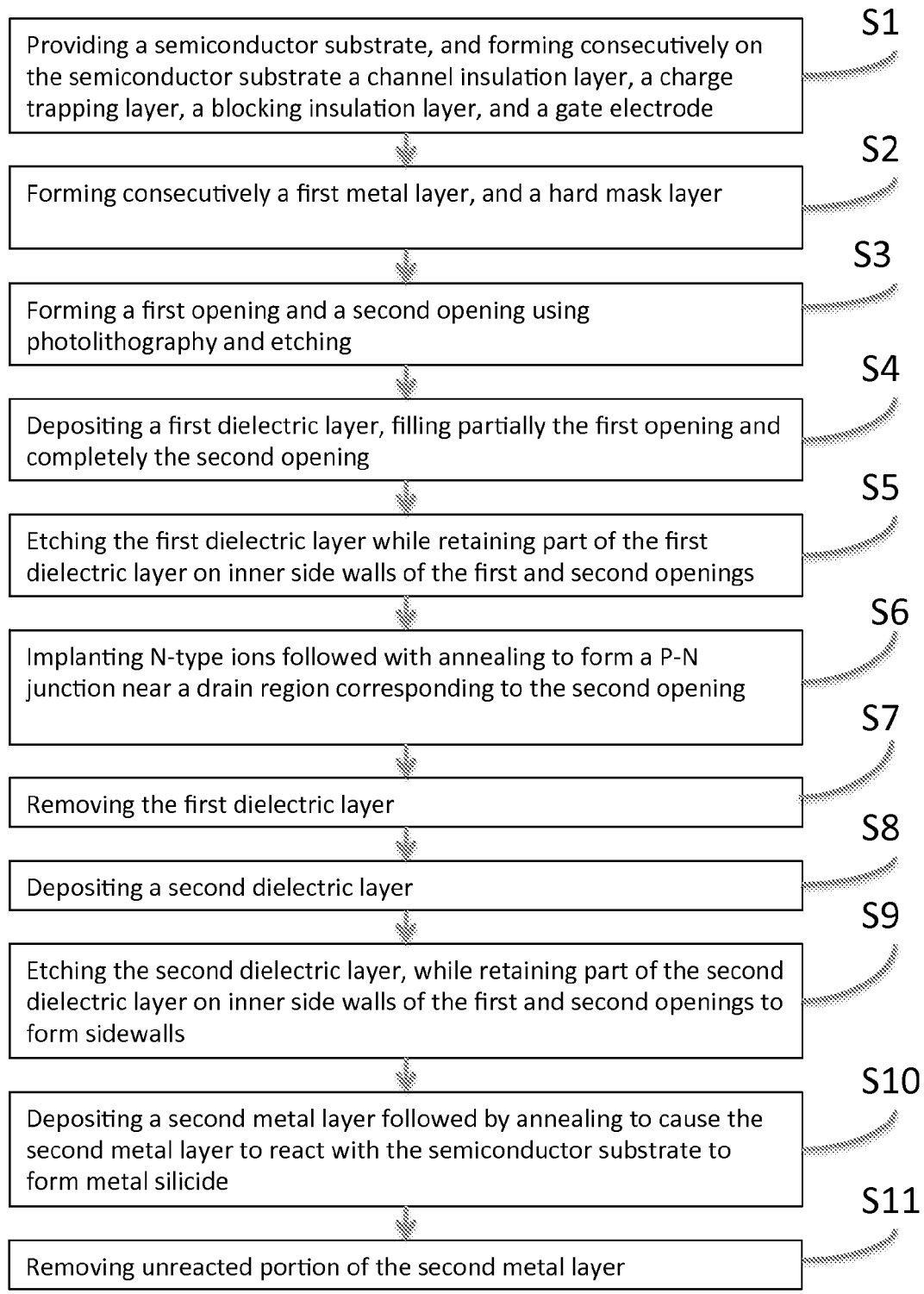
FIG. 2 is flowchart illustrating a method of making the charge trapping non-volatile semiconductor memory device according to a preferred embodiment.

Referring to FIG. 1, which shows a cross-sectional diagram illustrating a charge trapping non-volatile semiconductor memory device. The charge trapping non-volatile semiconductor memory device 10 comprises a semiconductor substrate 11, a channel insulation layer 12, a charge trapping layer 13, a blocking insulation layer, 14, a gate electrode 15, a first metal layer 16, a hard mask layer 17 and sidewalls 18. A drain region 110 and a source region 111 are formed near a surface of the semiconductor substrate 11. The channel insulation layer 12, the charge trapping layer 13, the blocking insulation layer, 14, the gate electrode 15, the first metal layer 16, and the hard mask layer 17 are consecutively formed on the semiconductor substrate over areas of the surface of the semiconductor substrate 11 other than the drain region 110 and the source region 111.

Formed in spaces above the semiconductor substrate 111 corresponding to the drain region 110 and the source region 111 are first opening 112 and second opening 114, respectively. The sidewalls 18 are formed in the first and second openings 112, 113, on sides of the layers from the channel insulation layer 12 to the hard mask layer 17. The drain region 11 has a contact hole (not shown) filled with a metal connected to a bitline. The gate electrode 15 and the first metal layer 16 together form a wordline (not shown).

Referring to FIGS. 2-13, FIG. 2 is flowchart illustrating a method of making the charge trapping non-volatile semiconductor memory device 10 according to a preferred embodiment. FIGS. 3-13 are cross-sectional diagrams illustrating steps of the method of making the charge trapping non-volatile semiconductor memory device 10. The method of making the charge trapping non-volatile semiconductor memory device 10 comprises the following steps.

Figure 3:
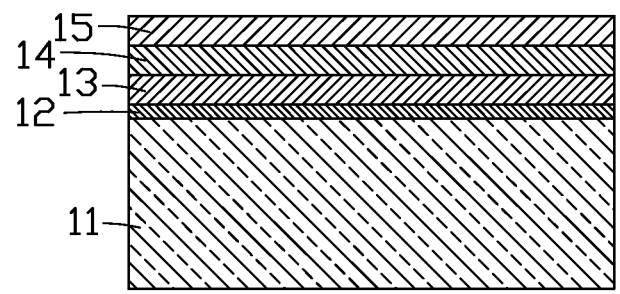
FIGS. 3 to 13 are cross-sectional diagrams illustrating steps of the method of making the charge trapping non-volatile semiconductor memory device.

Referring to FIG. 3, in step S1, a semiconductor substrate 11 is provided, and a channel insulation layer 12, a charge trapping layer 13, a blocking insulation layer, 14, and a gate electrode 15 are consecutively formed over the semiconductor substrate 11. This multi-layered structure from the semiconductor substrate 11 to the gate electrode 15 is structured as a silicon-oxide-nitride-oxide-silicon (SONOS) structure (not shown). The semiconductor substrate 11 can be a P-type semiconductor substrate. The channel insulation layer 12 can be formed using silicon dioxide ($SiO_2$). The charge-trapping layer 13 can be formed using silicon nitride ($Si_3Ni_4$). The gate electrode 15 can be a layer of polysilicon.

The channel insulation layer 12 can be formed by wet oxidation or free-radical oxidation. The charge trapping layer 13 and the blocking isolation layer 14 can be formed by atomic layer deposition (ALD), plasma enhanced ALD or chemical vapor deposition (CVD) followed by rapid thermal annealing (RTA).

Figure 4:
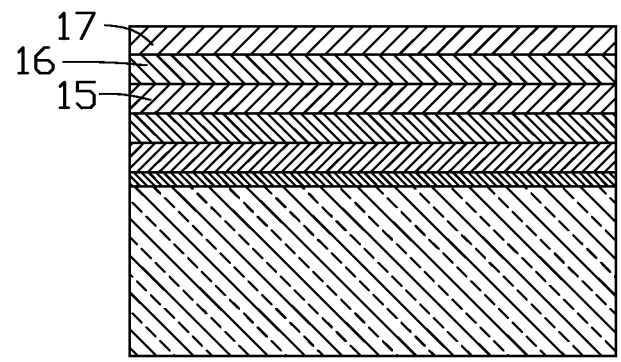

Referring to FIG. 4, in step S2, a first metal layer 16 and a hard mask layer 17 are formed consecutively over the gate electrode 15. The first metal layer can include tungsten or tungsten silicide. The first hard mask layer 17 can be a silicon dioxide layer or silicon nitride layer.

Figure 5:
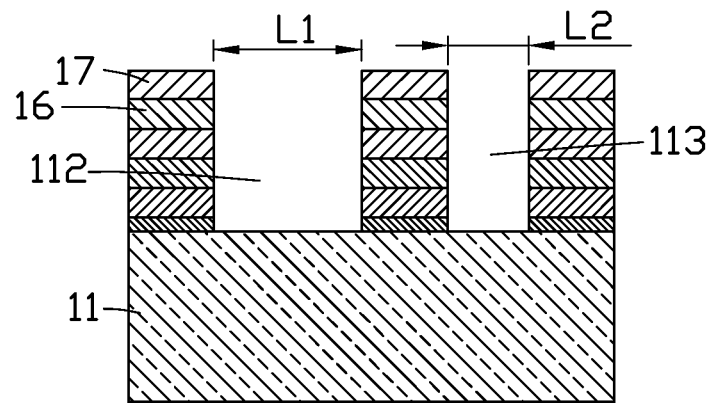

In step S3, photolithography is performed on the hard mask layer 17, followed by etching of the hard mask layer 17, the first metal layer 16 and the SONOS structure until corresponding portions of the semiconductor substrate are exposed, thereby forming the first opening 112 and the second opening 113 illustrated in FIG. 5. A width L1 of the first opening 112 is wider than a width L2 of the second opening 113.

Figure 6:
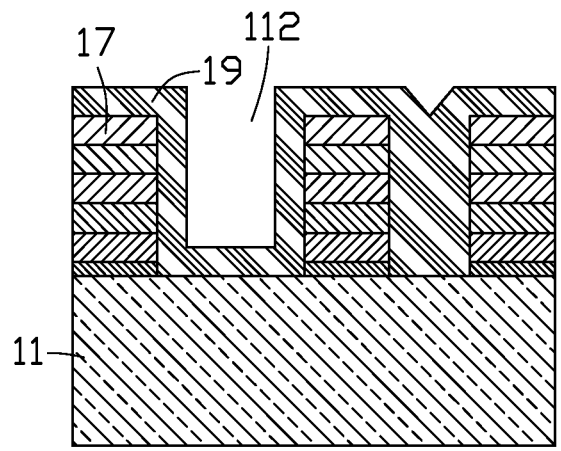

Referring to FIG. 6, in step S4, the first dielectric layer 19 is deposited over the hard mask layer 17 and the exposed portions of the semiconductor substrate. The first dielectric layer can be a silicon dioxide layer, silicon nitride layer or a combination thereof. A thickness of the first dielectric layer 19 is larger than L2/2 but smaller than L1/2. Thus, the first opening 112 is not completely filled while the second opening 113 is filled.

Figure 7:
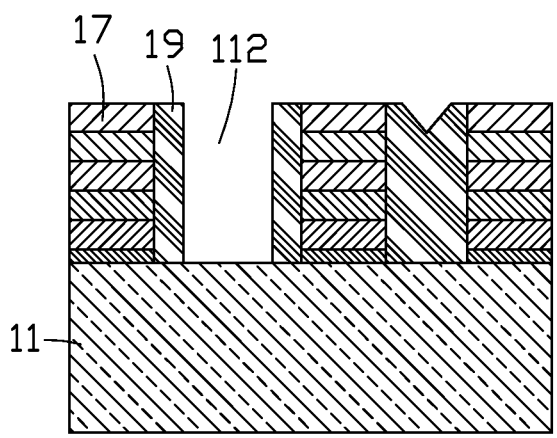

Referring to FIG. 7, in step S5, the first dielectric layer is etched using an anisotropic dry etching process, which removes part of the first dielectric layer covering the hard mask and part of the first dielectric layer covering the substrate in the first opening 112 while keeping part of the first dielectric layer covering sidewalls in the first opening 112.

Figure 8:
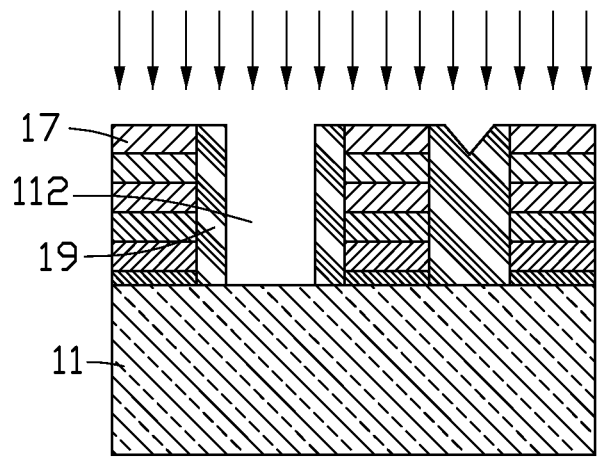

Referring to FIG. 8, in step S6, N-type dopant ions are implanted into the semiconductor substrate having the hard mask layer 17 and the first dielectric layer 19 formed thereon, and annealing is performed to form a P-N junction at the drain region 110 corresponding to the first opening 112.

Figure 9:
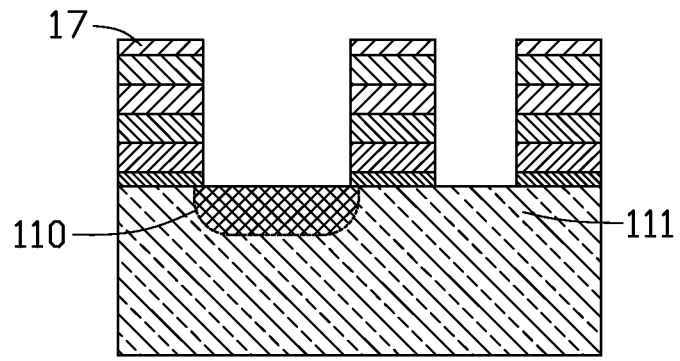

Referring to FIG. 9, in step S7, an anisotropic etching process is used to etch away the first dielectric layer 19, thinning the hard mask layer 17 during the process.

Figure 10:
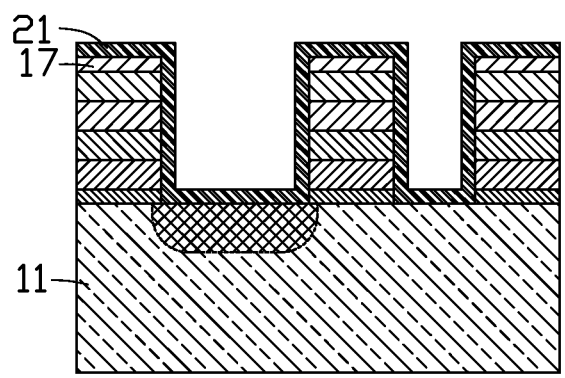

Referring to FIG. 10, in step S8, a second dielectric layer 21 is deposited over the semiconductor substrate 11 and the hard mask layer 17. The second dielectric layer 21 can be silicon dioxide, silicon nitride or a combination thereof. A thickness of the second dielectric layer is smaller than L2/2.

Figure 11:
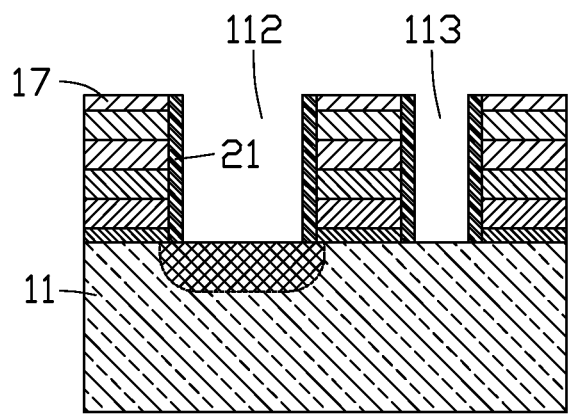

In step S9, an anisotropic etching process is used to etch away part of the second dielectric layer 21 deposited on the hard mask layer 17 and part of the second dielectric layer 21 deposited on the semiconductor substrate 11, while keeping part of the second dielectric layer 21 deposited on inside walls of the first and second openings 112, 113, thereby forming the sidewalls illustrated in FIG. 11.

Figure 12:
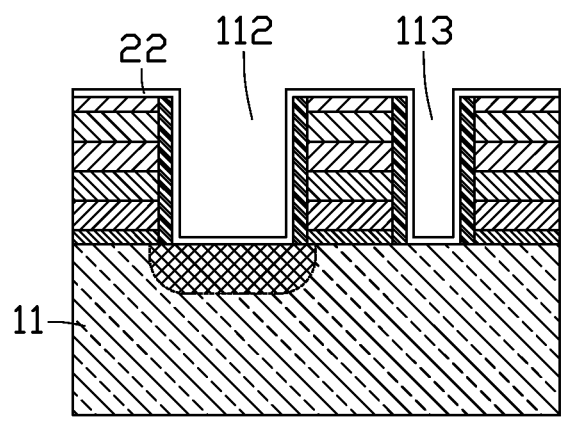

Referring to FIG. 12, in step S10, a second metal layer 22 is deposited over the semiconductor substrate 11, and an annealing process is used to cause the second metal layer 22 to react with the semiconductor substrate in the two openings 112, 113 to form metal silicide. The second metal layer 22 can be a titanium metal layer, a cobalt metal layer, a nickel metal layer, and a platinum metal layer, or one of their various combinations. The metal silicide contacts the semiconductor substrate 11 at the source region 111 corresponding to the second opening 113, thereby forming the metal-semiconductor junction (Schottky junction), as illustrated in FIG. 13, while the semiconductor junction at the drain region 110 is a P-N junction.

Figure 13:
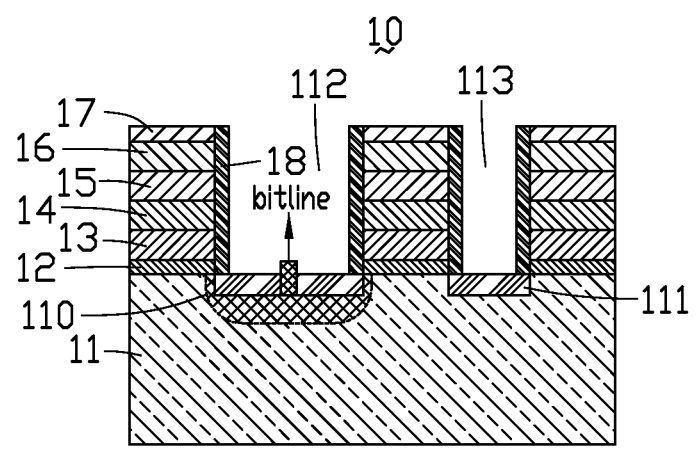

Referring to FIG. 13, in step S11, a wet etching process is used to remove the second metal layer 22 that has not reacted with the semiconductor substrate, and a third dielectric layer (not shown) is deposited to form a contact hole (not shown) at the second opening. The contact hole is to be filled with a metal, which will be connected to a bitline later on. Lastly, the gate electrode 15 and the first metal layer 16 together form a word line, and the charge trapping non-volatile semiconductor memory device is thus formed. Furthermore, because the resistivity of the first metal layer 16 is lower than that of the gate electrode 15, the gate electrode mainly forms the word line.

The drain region 110 and the source region 111 of the charge trapping non-volatile semiconductor memory device 10 made using the method according to embodiments of the present disclosure have a P-N junction and a Schottky junction, respectively. The Schottky structure is formed between the semiconductor substrate and a metal including titanium, cobalt, nickel, platinum or a combination thereof. The barrier of the Schottky junction should be relatively low so that programming by hot electron injection near the source region can be effectively performed. Therefore, when using the charge trapping non-volatile semiconductor memory device, only low gate voltage and low drain voltage are needed to produce hot electrons near the source region, resulting in high hot-electron injection efficiency, low programming voltage, fast programming speed, and low energy consumption.

Furthermore, the asymmetrical source/drain structure of the charge trapping non-volatile semiconductor memory device helps to reduce diode leakage toward the drain, increasing device reliability.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A method of manufacturing a non-volatile semiconductor memory device, the method comprising:
    forming consecutively a channel insulation layer, a charge trapping layer, a blocking insulation layer, and a gate electrode layer over a semiconductor substrate;
    forming a first opening corresponding to a drain region in the semiconductor substrate and a second opening corresponding to a source region in the semiconductor substrate, the first opening having a first width and the second opening having a second width, the first width being larger than the second width;
    depositing a first dielectric layer;
    etching the first dielectric layer to expose the semiconductor substrate through the first opening but not through the second opening;
    forming a P-N junction at the drain region while no P-N junction is formed at the source region;
    removing the first dielectric layer; and
    forming a metal layer over the source region and causing the metal layer to react with the semiconductor substrate to form a metal-semiconductor junction at the source region.

2. The method of manufacturing a non-volatile semiconductor memory device according to claim 1, wherein depositing a first dielectric layer comprises depositing a first dielectric layer having a thickness smaller than half the first width but larger than half the second width.

3. The method of manufacturing a non-volatile semiconductor memory device according to claim 1, wherein the method further comprises implanting ions into the drain region to form the P-N junction while covering the source region with the first dielectric layer.

4. The method of manufacturing a non-volatile semiconductor memory device according to claim 3, wherein the method further comprises removing the first dielectric layer before forming the metal layer.

5. The method of manufacturing a non-volatile semiconductor memory device according to claim 1, wherein the method further comprises forming dielectric sidewalls along sides of the first and second openings after removing the first dielectric layer.

6. The method of manufacturing a non-volatile semiconductor memory device according to claim 1, wherein an annealing process is used to cause the second metal layer to react with the semiconductor substrate in the second opening to form metal silicide, the metal silicide forming the metal-semiconductor junction with the semiconductor substrate in the second opening corresponding to the source region.

7. The method of manufacturing a non-volatile semiconductor memory device according to claim 1, wherein the method further comprises removing part of the metal layer that has not reacted with the semiconductor substrate.

8. The method of manufacturing a non-volatile semiconductor memory device according to claim 3, wherein the semiconductor substrate is a P-type substrate and the ions are N-type ions.

* * * * *